(12) United States Patent
Boccia et al.

(10) Patent No.: US 6,575,375 B1
(45) Date of Patent: Jun. 10, 2003

(54) PORTABLE INTEGRATED CIRCUIT DEVICE AND METHOD FOR THE PRODUCTION THEREOF

(75) Inventors: Henri Boccia, Belcodene (FR); Olivier Brunet, Marseilles (FR); Philippe Patrice, Marseilles (FR); Isabelle Limousin, Aix en Provence (FR)

(73) Assignee: Gemplus, Gemenos (FR)

( * ) Notice: Subject to any disclaimer, the term of this patent is extended or adjusted under 35 U.S.C. 154(b) by 0 days.

(21) Appl. No.: 09/980,207

(22) PCT Filed: May 11, 2000

(86) PCT No.: PCT/FR00/01271

§ 371 (c)(1),
(2), (4) Date: Nov. 30, 2001

(87) PCT Pub. No.: WO00/73988

PCT Pub. Date: Dec. 7, 2000

(30) Foreign Application Priority Data

May 31, 1999 (FR) ............................................. 99 06849

(51) Int. Cl.[7] ................................................ G06K 5/00
(52) U.S. Cl. ........................................ 235/492; 235/380
(58) Field of Search .............................. 235/380, 382.5, 235/492

(56) References Cited

U.S. PATENT DOCUMENTS

| | | | | |
|---|---|---|---|---|
| 4,393,610 A | * | 7/1983 | Adrian .......................... 40/625 |
| 4,639,585 A | * | 1/1987 | Haghiri-Tehrani et al. .. 235/492 |
| 5,049,728 A | * | 9/1991 | Rovin .......................... 235/492 |
| 5,155,663 A | * | 10/1992 | Harase .......................... 361/684 |
| 5,757,116 A | * | 5/1998 | Nishikawa et al. .......... 235/492 |
| 5,835,781 A | * | 11/1998 | Steeg et al. ..................... 712/1 |
| 5,975,584 A | * | 11/1999 | Vogt .............................. 283/98 |

FOREIGN PATENT DOCUMENTS

| | | |
|---|---|---|
| DE | 29819389 | 3/1999 |
| EP | 0254444 | 1/1988 |
| EP | 0535436 | 4/1993 |

* cited by examiner

*Primary Examiner*—Mark Tremblay
(74) *Attorney, Agent, or Firm*—Burns, Doane, Swecker & Mathis, L.L.P.

(57) ABSTRACT

A portable integrated circuit device has a supporting body and a detachable mini-card bearing an integrated circuit. The mini-card is disposed on one end of the supporting body which has an elongated shape. The invention can be used for SIM cards in new generation mobile telephones.

9 Claims, 2 Drawing Sheets

PORTABLE INTEGRATED CIRCUIT DEVICE AND METHOD FOR THE PRODUCTION THEREOF

This disclosure is based upon French Application No. 99/06849, filed on May 31, 1999 and International Application No. PCT/FR00/01271, filed May 11, 2000, which was published on Dec. 7, 2000 in a language other than English, the contents of which are incorporated herein by reference.

BACKGROUND OF THE INVENTION

The invention concerns a portable integrated-circuit device having a support body and a detachable minicard of the smart card type with a smaller format compared with the standard format of smart cards. It also relates to a method for manufacturing the said device.

It will be recalled that integrated-circuit cards with flush contacts make it possible for example to perform secure transactions of the electronic money, identification or telecommunication type. The dimensions of the cards and the positioning of the contacts are defined by a standard corresponding to the international standards ISO 7810, 7816-1 and 7816-2.

This first standard defines a card with or without contact as a thin portable element with the dimensions: 85 mm long, 54 mm wide and 0.76 mm thick.

A second standard has defined the format of smart cards dedicated to the mobile telephony market.

Smart cards dedicated to telephony have a smaller format compared with the ISO format which has just been given. These are minicards, known as SIM cards, 25 mm long and 15 mm wide, the thickness being identical to the thickness of the cards complying with the first standard.

It should be stated that an integrated-circuit card with contact has a PVC or ABS plastic device according to the standard format. This device carries at least one electronic microcircuit (also referred to as an electronic module or electronic micromodule in the literature) and a series of contact areas for the electrical connection of the microcircuit to an operating circuit.

It should also be stated that, according to a known method of manufacturing such a card, the support of the integrated-circuit card is produced by moulding a plastics material or by lamination, and then the microcircuit is incorporated in the card support during a so-called "insetting" operation. In practice, the microcircuit is glued in a cavity provided for this purpose in the support.

It should also be stated that, up to the present time, an integrated-circuit card with contact with a format which is smaller (minicard) compared with the standard format, is produced using the method for manufacturing a standard-format card, which ends with an operation of partial pre-cutting of the card support in order to delimit a region comprising the contacts zone.

It is therefore in this support that the smaller-format card is then produced, producing a slot with a contour which is formed in this support around an internal portion including the microcircuit and the contact areas. This slot delimits the card complying with the second format corresponding to the minicard, which is connected to the standard-format card by tabs which were carefully left during the formation of the contour slot so that the standard-format card serves as a support for the minicard.

The minicard is detached either by cutting a tab by means of a tool, or by causing the rupture of these tabs by pressing on the internal portion by means of a tool or more simply with the finger.

It is only at the end of manufacture of the card that the precutting is carried out, for example by punching or by means of a cutting tool such as a laser beam or a high-pressure water jet.

An example of an embodiment of such a card is for example described in the document EP A-0 521 728.

The mobile telephony market is constantly changing and the trend is towards a maximum miniaturisation of the mobile terminals. Because of this, miniaturisation of the minicard format seems to be a necessity in order not to be detrimental to the miniaturisation of the terminals.

The trend is therefore towards a reduction in the format of the cards intended to equip the new generations of mobile telephones while seeking to preserve the size of the integrated circuits and even increasing it.

It is this new generation of portable devices that is involved. This is because the portable devices with minicards as proposed up to the present time consist of the ISO standard format card. This proves to be a technology which is difficult to implement with the new-generation portable devices, which are going to have dimensions which are even smaller than those proposed up to the present time.

SUMMARY OF THE INVENTION

The present invention proposes to afford a solution which is more economical since it is better adapted to the very small dimensions of the portable integrated-circuit devices dedicated to the new generations of mobile telephones whilst allowing easy handling of these devices and keeping the advantages of graphical personalisation.

The invention relates to a portable integrated-circuit device having a support body and a detachable minicard carrying the integrated circuit, principally characterised in that the minicard is disposed at one end of the support body.

According to a first embodiment, the minicard is connected to the support body by a breaking line.

According to a second embodiment, the minicard is connected to the support body by an adhesive disposed on one of its principal faces.

According to another characteristic, the support body is in the shape of a tongue.

Advantageously, the tongue is rectangular.

Advantageously, the tongue has a width substantially equal to that of the minicard.

Another object of the invention is a method for manufacturing a portable device with an integrated circuit for which the integrated circuits have previously been attached to a support film including the contact areas and the said integrated circuits have been connected to the corresponding contact areas thus forming micromodules, principally characterised in that it includes the following steps:

placing the support film comprising a plurality of micromodules in an injection mould, moulding on the said film on the opposite side to the contact areas, by means of a plastics material, so as to form a panel, cutting the panel so as to obtain support bodies having at one of their ends the minicard formed by the micromodule housed in the plastics material.

According to another characteristic, the method includes a step of precutting the end of the support bodies.

According to one embodiment, the precutting is carried out during the overmoulding operation, the mould having an adapted shape so as to obtain this precutting.

According to another embodiment, the precutting is carried out during the cutting of the support bodies.

In the case where the support film is a dielectric, the material of the dielectric is identical to that of the overmoulded plastic material.

BRIEF DESCRIPTION OF THE DRAWINGS

Other particularities and advantages of the invention will emerge clearly from a reading of the description made below, given by way of non-limitative example and with regard to the drawings, in which.

DESCRIPTION OF THE INVENTION

Figure 1:
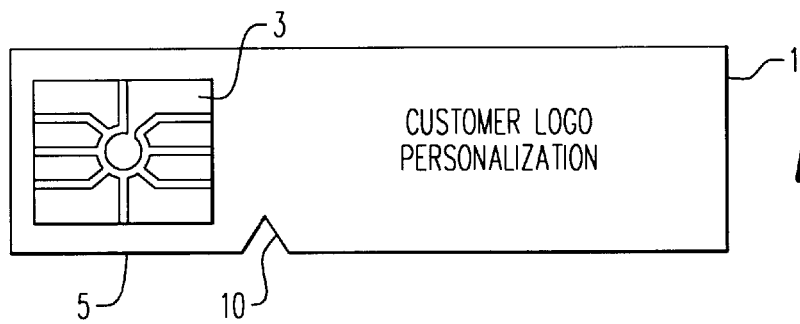
FIG. 1 depicts the diagram of a first embodiment of a device according to the invention.

The device illustrated in FIGS. 1 to 5 is in the form of a plastic tongue (or strip) of the PVC or ABS type. This tongue can be obtained by moulding and then machining of the minicards intended to receive the micromodules or preferably by overmoulding of the micromodule in the case of the embodiment depicted in FIGS. 1 and 2.

The portable integrated-circuit device 2 therefore has a support body 1 of elongate shape having a free end 5 and a minicard disposed at this end 5 of the body 1, and more precisely in this end 5.

The integrated circuit 2 could be glued in the cavity formed at the end 5 of the support tongue. However, according to the manufacturing method proposed for this embodiment, the micromodule (the assembly formed by the integrated circuit, the contact areas and the electrical connections between the integrated circuit and the contact areas) is fixed by effecting an overmoulding by injection of material into a mould, the micromodule being placed in the said mould.

The minicard is connected to the support body by a rupture line, which can be produced by a series of perforated points, tabs, or a thinning of the thickness of the body.

Advantageously, the end 5 has a partial precutting 10 in thickness and width to make it possible to detach this end from the rest of the tongue and to obtain the integrated-circuit minicard 50, hereinafter referred to as a mini-SIM 3G. It is possible to detach the end 5 either with a cutting tool or by causing the end to pivot about the axis of the cut.

Preferably, the support tongue will have a width substantially equal to that of the 3G mini-SIM card. The advantage is to optimise the surface to be personalised without any drawback in manufacture.

Figure 4:
FIG. 4 depicts a diagram of a second embodiment of a device according to the invention.
Figure 5:
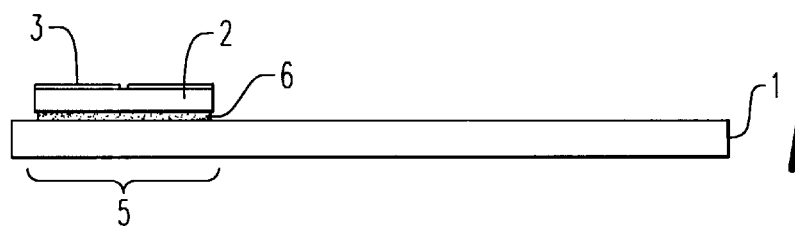
FIG. 5 depicts a view in transverse section according to FIG. 4, FIGS. 6A and 6B illustrate the manufacturing method in a variant embodiment.

In the case of the second embodiment of the support tongue illustrated by FIGS. 4 and 5, the minicard consists of the micromodule, which is fixed to the surface of the tongue by a dual-face adhesive 6 for example.

Thus the minicard can be detached from the tongue and placed in a new-generation mobile telephone.

Figure 2:
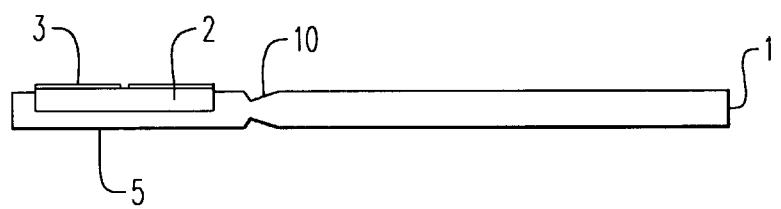
FIG. 2 depicts a view in transverse section according to FIG. 1.
Figure 3:
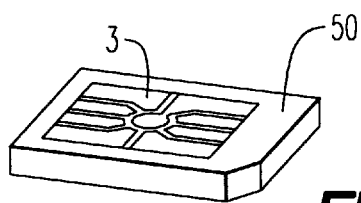
FIG. 3 depicts the minicard obtained after detachment of the end of the device 1.

The invention proposes a manufacturing method which is particularly adapted to the first embodiment of the portable devices, described with regard to FIGS. 1 and 2.

Figure 6A:
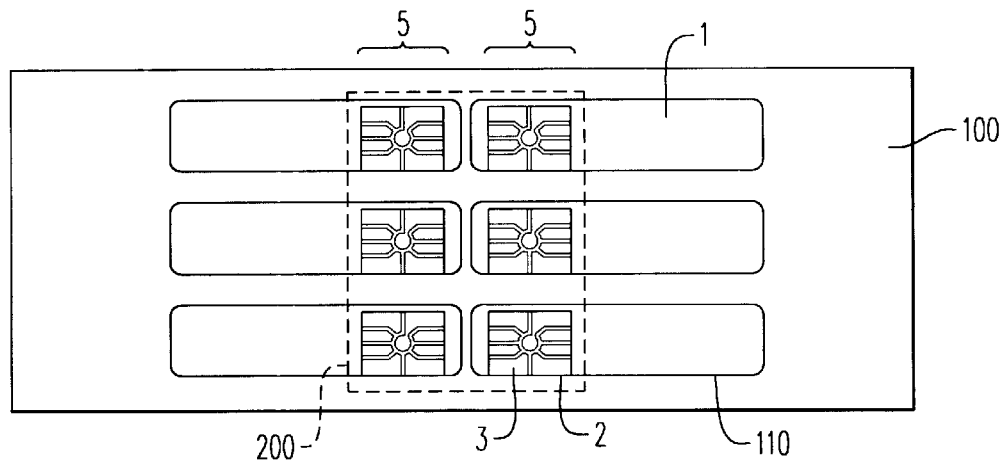
Figure 6B:
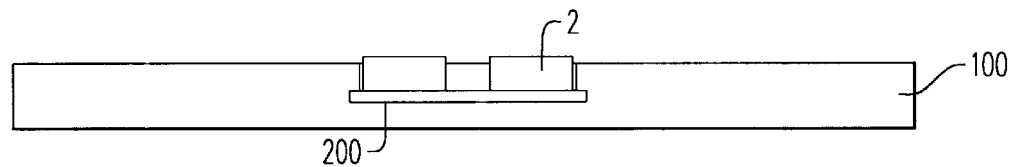
Figure 7:
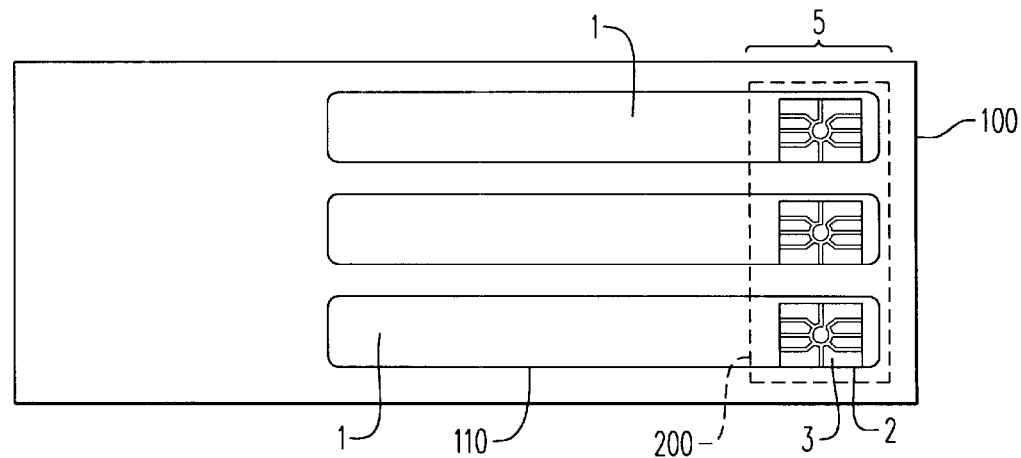
FIG. 7 illustrates the method in another variant embodiment.

FIGS. 6A, 6B and 7 illustrate this method. An overmoulding is effected on the support film 200 of the micromodules 2–3.

This is because, in the technique for manufacturing portable devices, the technique of manufacturing the micromodules before the insetting step is used. At this stage, the integrated circuits are fixed to a support film, which can consist of a dielectric film carrying the metallic contact grid on its second face or directly on the metallic contact grid, the integrated circuit being glued to this grid by an insulating material.

In all cases, at this stage the contact pads of the integrated circuits are electrically connected to the corresponding contact areas.

It is therefore proposed according to the invention to cut portions of support film 200 so as to have 2×n micromodules 2–3 (FIG. 6A) or 1×n micromodules 2–3 (FIG. 7) and to dispose the portions of film 200 in plastic injection moulds.

After the injection a panel 100 is obtained in which the micromodules 2 are embedded.

Strips or tongues 1 are cut, by means of a suitable tool (punch, laser or other), along the cutting lines 110 in order to obtain the shape depicted in the diagrams.

In the case of FIG. 6A, a larger number of support tongues will be obtained than in the case of FIG. 7. However, if the same moulds are kept, the variant illustrated by FIG. 7 will make it possible to have longer tongues than those in FIG. 6A.

By way of example, the dimensions of the tongues which have been produced are between 4 and 9 cm for the length and approximately 10 mm for the width.

What is claimed is:

1. A portable element of the type provided with a support body having a partial precut which makes it possible to detach a card from said support body, the card comprising a module having at least one integrated circuit, a contact area and an electrical connection between said circuit and said contact area, and wherein the card is a minicard with a format smaller than the SIM standard, and the support body comprises a tongue of width substantially equal to that of the minicard, said minicard being disposed at one end of the support body which has the partial precut.

2. An element according to claim 1, wherein the minicard has a width equal to that of the support body and is connected to said support body by a rupture line.

3. An element according to claim 1 wherein the module is fixed to the support body by an adhesive disposed on one of its principal faces.

4. An element according to claim 1 wherein the support body has the shape of a substantially rectangular tongue that is elongated compared with the width of the minicard.

5. A method of manufacturing a plurality of portable elements comprising the steps of:

attaching integrated circuits to a support film having contact areas;

connecting said integrated circuits to the corresponding contact areas thus forming modules;

placing the support film with a plurality of modules in an injection mould;

overmoulding the film, on a side opposite to the contact areas, with a plastic material, so as to form a panel comprising the plurality of modules; and cutting the panel to a shape of the support body so as to obtain the portable elements, the modules of said portable elements being housed in the plastic material of the corresponding support body.

6. A manufacturing method according to claim 5, further including a step of partial precutting of the end of the support body, of width substantially equal to that of the support body.

7. A manufacturing method according to claim 6, wherein the precutting is carried out during the overmoulding, the mould having an adapted shape of width substantially equal to that of the support body in order to obtain a precut.

8. A manufacturing method according to claim 6, wherein the precutting is performed during the cutting of the support bodies from the panel over a width substantially equal to that of the support body.

9. A manufacturing method according to claim 5 wherein the support film is a dielectric, and the dielectric material of the support film is identical to that of the overmoulded plastic material.

* * * * *